INVENTOR
JOSEPH P. PAWLETKO

BY

ATTORNEY

United States Patent Office 3,530,308
Patented Sept. 22, 1970

3,530,308

SIGNAL ATTENUATING CIRCUIT USING TRANSISTOR WITH DIRECT CURRENT ISOLATED COLLECTOR AND NONLINEAR BASE INPUT COMPENSATION

Joseph P. Pawletko, Endwell, N.Y., assignor to International Business Machines Corporation, Armonk, N.Y., a corporation of New York Original application July 6, 1965, Ser. No. 469,499, now Patent No. 3,471,832, dated Oct. 7, 1969. Divided and this application June 5, 1969, Ser. No. 830,643
Int. Cl. H03k *5/08;* H03g *3/30*
U.S. Cl. 307—237 2 Claims

ABSTRACT OF THE DISCLOSURE

An improved variable gain amplifier is characteried by a transistor amplifier having an input circuit which includes a shunt impedance comprising a common emitter transistor amplifier, the collector-to-emitter impedance of which forms the variable impedance of the input circuit. The collector-to-emitter impedance is controlled by the level of a gain control voltage applied to the base electrode of the shunt transistor. A nonlinear base input circuit for the shunt transistor substantially compensates for the inherent nonlinear voltage-current characteristic of the transistor base-emitter junction, as well as the offset volage of the base-emitter diode, whereby the shunt impedance varies substantially linearly with the input gain control voltage.

Figure 1:
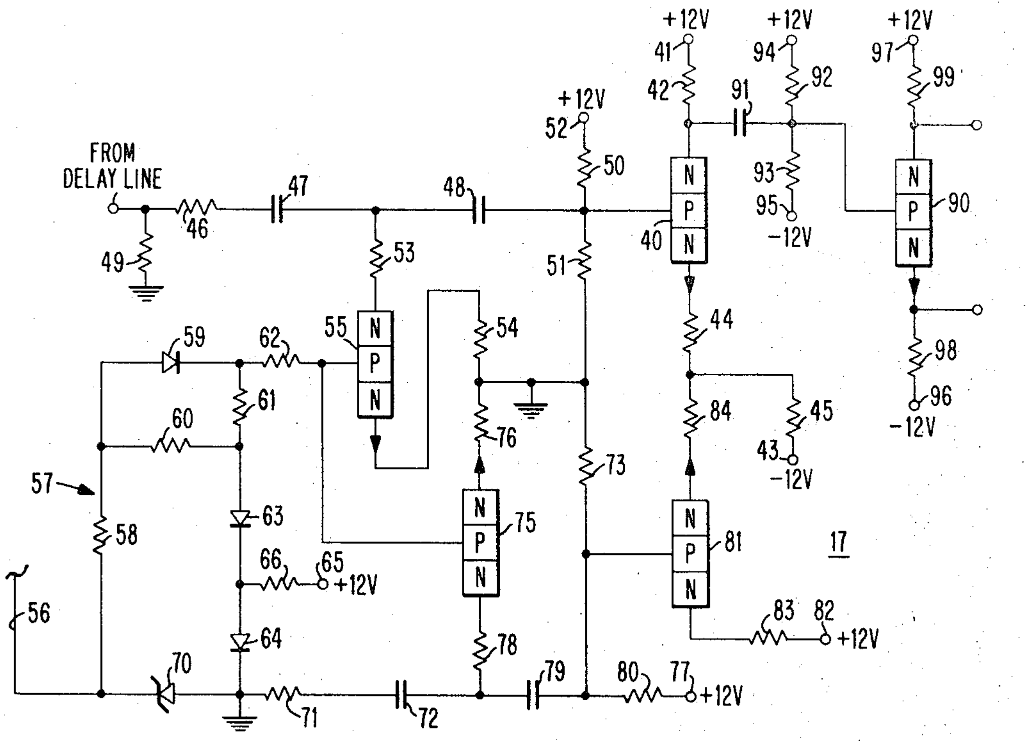

This application is a division of U.S. application Ser. No. 469,499 filed July 6, 1965, now U.S. Pat. 3,471,832.

The improved circuit of the present application has been designed for application in an environment wherein input signal levels vary substantially in amplitude. In a typical application, maximum and minimum voltage levels are frequently in the order of three-tenths millivolt and sixteen millivolts, respectively. This is the minimum to maximum signal ratio in the order of about one to fifty-four.

In order to assure optimum operation of the circuits, it is desirable to minimize this minimum to maximum signal ratio, for example, to a ratio in the order of one to six.

Accordingly, it is a primary object of the present invention to provide improved means responsive to input signals for producing output signals, the relative amplitudes of which are made more uniform.

One requirement is that the improved signal compression means be extremely rapid. Further, the rapid response to changes in the degree of compression must not distort the signals being compressed. It is important that no phase shift is introduced and that the reference level about which the signals swing is not shifted.

Accordingly, it is an important object of the present invention to provide an improved signal compression circuit in which rapid changes in the compression level do not introduce substantial noise, phase shift, reference level shift or distortion into the signals being compressed.

These objects are achieved in one preferred embodiment of the present invention by means of an improved variable gain amplifier. The improved variable gain amplifier is characterized by a transistor amplifier having an input circuit which includes a shunt impedance comprising a common emitter transistor amplifier, the collector-to-emitter impedance of which forms the variable impedance of the input circuit. The collector-to-emitter impedance is controlled by the level of a gain control voltage applied to the base electrode of the shunt transistor. A nonlinear base input circuit for the shunt transistor substantially compensates for the inherent nonlinear voltage-current characteristic of the transistor base-emitter junction, as well as the offset voltage of the base-emitter diode, whereby the shunt impedance varies substantially linearly with the input gain control voltage.

In operating the shunt transistor as a variable impedance, the collector electrode is isolated from direct-current voltage supplies and the base-emitter junction is operated at low current-voltage levels.

It is another important object of the present invention to provide an improved variable gain amplifier characterized by a shunt connected transistor amplifier, the collector-to-emitter impedance of which varies substantially linearly as a function of the input control signal level.

The foregoing and other objects, features and advantages of the invention will be apparent from the following more particular description of preferred embodiments of the invention, as illustrated in the accompanying drawings.

Figure 2:
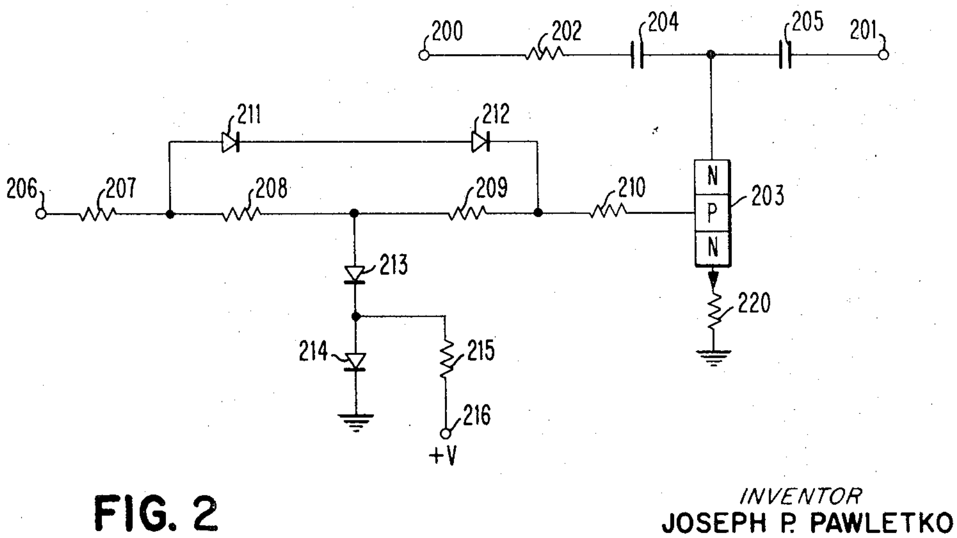

In the drawings:

FIG. 1 is a schematic diagram of one form of the variable gain amplifier of the present application; and FIG. 2 is a schematic diagram of another form of the improved linear transistor shunt circuit of the present application.

The amplifier 17 shown in detail in FIG. 1 includes an input signal transistor amplifier 40 having its collector electrode connected to a positive supply terminal 41 by way of a resistor 42 and having an emitter electrode connected to a negative supply terminal 43 by way of resistors 44 and 45. The base electrode is coupled to a source of input signals (not shown) by way of a resistor 46 and capacitors 47 and 48. A resistor 49 connects the input signal source to ground potential for impedance matching. The base electrode is also connected to a voltage divider including a pair of resistors 50 and 51 connected between ground potential and a positive supply terminal 52.

The junction between the capacitors 47 and 48 is connected to ground potential by way of a variable impedance, signal attenuating circuit comprising a pair of resistors 53 and 54 connected respectively to the collector and emitter electrodes of a transistor 55 which is operated as a variable impedance in accordance with the voltage level of signals received by way of a conductor 56.

The impedance of the amplifier 55 would normally vary nonlinearly with respect to voltages applied to the base thereof; and therefore, a compensating circuit 57 is provided between the control input line 56 and the base electrode to cause the amplifier 55 to vary its impedance linearly with respect to the input voltage level on the line 56. This will be described in greater detail below.

The compensating circuit 57 includes a series circuit comprising a resistor 58, a diode 59 connected in parallel with a pair of resistors 60 and 61, and a resistor 62. The junction between the resistors 60 and 61 is connected to ground potential by way of series-connected diodes 63 and 64, and the junction between the diodes is connected to a positive supply terminal 65 by way of a resistor 66. A Zener diode 70 connects the input control line 56 to ground potential for limiting the positive level of input control signal to the reverse breakdown voltage of the Zener diode.

Rapid positive and negative changes in the control signal level on the line 56, which rapidly vary the impedance of the amplifier 55, cause transients to be produced across the resistors 53 and 54, and these transients appear as noise at the base input of the transistor amplifier 40.

Means forming a symmetrical channel are provided for cancellation of the transition signal. This means includes a second transistor 75 having its base electrode connected directly to the base electrode of amplifier 55, having its emitter electrode connected to ground potential by way of a resistor 76 and having its collector electrode connected to a resistor 78. The resistor 78 is connected to the junction between a pair of capacitors 72 and 79. The base electrode of a transistor 81 is connected to a resistor 80 which returns to a positive voltage terminal 77, and to the capacitor 79. The capacitor 72 is connected to a resistor 71 which is returned to ground potnetial.

The transistor 81 has its collector electrode connected to a positive supply terminal 82 by way of a resistor 83 and has its emitter electrode connected to the negative supply terminal 43 by way of a resistor 84 and the resistor 45.

The collector networks of the transistors 55 and 75 are dynamically equivalent, providing identical transition signals at base electrodes of the transistors 40 and 81. Transistors 40 and 81 coact to provide a differential amplifier. Identical signals on bases of transistors 40 and 81 assure that no net current change occurs in either transistor, the currents being supplied by the constant current source provided by the negative supply terminal 43 and the resistor 45. Thus, common mode transients produced by the gain control signal are rejected.

The collector electrode of the signal amplifier 40 is coupled to the base electrode of a transistor amplifier 90 by means of a capacitor 91. The base electrode of the transistor amplifier 90 is connected to the junction between a pair of bias resistors 92 and 93 which form a voltage divider between positive and negative supply terminals 94 and 95. The emitter and collector electrodes of the amplifier 90 are connceted to negative and positive supply terminals 96 and 97 by means of resistors 98 and 99. Out-of-phase output signals are derived from the emitter and collector electrodes of the amplifier 90.

The control voltage on the line 56 is positive with respect to ground. In the preferred embodiment, the positive level on the line 56 is limited to three volts by the Zener diode 70. Thus a potential somewhere between ground and plus three volts is applied to the compensating circuit 57 for application to the amplifier 55 to operate the latter as a variable impedance.

The general concept of operating a transistor as a variable impedance for signal attenution is set forth in an article by Fred Susi, entitled "Solving the AGC Dilemma," appearing in the July 19, 1963 publication of Electronics.

Briefly, the collector electrode is isolated from direct current voltage supplies. Signals which are to be attenuated, are applied to a voltage divider including an input series resistance and the emitter-collector circuit of the transistor. Output signals are taken across the emitter-collector circuit. Input and output terminals are capacitively coupled to the collector electrode.

This basic arrangement is illustrated in FIG. 2 by input and output terminals 200 and 201, a series resistance 202, a transistor 203 and coupling capacitors 204 and 205.

With the collector electrode isolated from direct sources, each base current level defines a different impedance value between the emitter-collector terminals. So long as the signlas which are capacitively coupled to the collector electrode do not exceed a maximum peak-to-peak value which is extremely low, the resistance exhibited bewteen the emitter-to-collector terminals will remain substantially constant, thereby assuring substantially linear attenuation, whereby the output signals are not distorted.

This maximum peak-to-peak collector voltage should be maintained below one hundred millivolts and preferably to about twenty or thirty millivolts to minimize distortion.

It will be recalled that the control voltage on line 56 of FIG. 1 varies between zero and approximately plus three volts. This voltage is substantially a linear function of the amplitudes of the input signals which are to be attenuated. Hence, it is desirable to provide attenuation which is substantially a linear function of the control voltage.

This requires a transistor resistance which is substantially an inverse linear function of the input control voltage. However, over an input range of three volts applied to the base electrode, the base current varies exponentially. This results in an exponential variation in transistor impedance.

To compensate for this nonlinear characteristic, a nonlinear impedance network is interposed between the input control voltage terminal 206 and the base electrode of the transistor.

The description will be directed first to the embodiment of FIG. 2 and then to that of FIG. 1.

The nonlinear impedance network in FIG. 2 includes series-connected resistors 207–210 inclusive, diodes 211 and 212 which are connected in parallel with the resistors 208 and 209, diodes 213 and 214 which are connected between ground potential and the junction between the resistors 208 and 209, and a resistor 215 which connects the junction betwen the diodes 213 and 214 to a positive supply terminal 216.

The resistor 215 is selected to produce through the diode 214 a current which produces a voltage drop across the diode which voltage drop is close to, but below the threshold voltage at which the base-emitter junction of the transistor 203 begins to exhibit significant base current. This voltage current reverse biases the diode 213.

A diode is used in place of a resistor voltage divider to provide thermal tracking with the base-emitter voltage to assure a reasonably constant threshold level. A silicon transistor 203 is used in order to minimize variations in the compression ratio in response to variations in the ambient temperature. The compression ratio is a function of the applied collector voltage divided by the transistor impedance, e.g., the collector current $I_c$. The collector current is defined by the equation:

$$I_c = hfeI_b + (hfe+1)I_{co}$$

where:

$hfe$ is the current amplification factor,
$I_b$ is the base current, and
$I_{co}$ is the leakage current.

The leakage current is small in silicon transistors so that the term $(hfe+1)I_{co}$ is insignificant, and the compression ratio is determined esentially by the term $(hfeI_b)$.

The resistor 220 makes the circuit less device dependent by providing emitter degeneration.

With zero potential applied to the input terminal 206, the diode 213 is reverse biased by a potential substantially equal to the voltage drop across the diode 214. As the input voltage is increased positively toward this value, the impedance of the diode 213 is extremely high and passes substantially no current. Under these conditions the impedance of the base-emitter junction of the transistor 203 is extremely high and substantially no current flows through the base-emitter junction. The impedance of the transistor 203 is at its highest value to provide minimum attenuation of alternating current signals applied to the input terminal 200.

As the control voltage applied to the terminal 206 is increased beyond the $V_{BE}$ threshold, the transistor 203 begins to conduct. To decrease the rate of base current increase, the shunt network consisting of diodes 213 and 214 comes into play. The shunting action of the diode 213 causes the increase in base current in the transistor 203 to vary substantially linearly with the input voltage until the input voltage reaches a value at which the diode 213 begins to enter into its low impedance region. If it were not for the diodes 211 and 212, the diode 213 would thereafter shunt substantially all additional increases in current in the network as a result of further increases in the input control voltage. This occurs in the preferred embodiment with the component values set forth below at an approximate one and twenty-five hundredths volt input level at terminal 206.

As the shunt network 213, 214 tends to approach this limit, the voltage differential between resistors 207 and 210 tends to forward bias diodes 211 and 212. Further increase in voltage at 206 results in higher forward current through the diodes supplying more base current to the transistor 203. The current through the diodes 211 and 212 increases at a rate sufficient to cause the base current to increase substantially linearly with further increases in control voltage. The voltage-current characteristics of the diodes and the base-emitter junction are such as to produce a reasonably linear variation in base current with variations in control voltage from a value equal to the drop across the diode 214 to approximately three volts. In one embodiment, the maximum base current was about twenty-five microamperes.

The values of the resistors 207–210 can be changed to vary the base current levels. Also, the emitter bias of the transistor 220 can be initially set to cause initial base current at selected control voltage values other than thirty-seven hundredths volt.

A resistor 220 is connected between the emitter electrode and ground potential for the purpose of obviating the need for matching base-emitter impedance characteristics of the transistor 203 from machine to machine. This resistor minimizes the effect of different base-emitter characteristics.

The value of the resistor 210 in the base circuit of the transistor 203 determines to a great extent the slope of the input voltage-base current curve and therefore, the resistance exhibited by the transistor 203 for a given input. The signal attenuating circuit of FIG. 1 is similar to that of FIG. 2.

The resistor 53 in the embodiment of FIG. 1 is included to provide some isolation between the collector electrode and the coupling capacitors 47 and 48. In the embodiment of FIG. 1 a single diode 59, rather than a pair of diodes such as 211 and 212, was found to give satisfactory operation.

As indicated above, the configuration of FIG. 1, including the resistors 53 and 54 and the transistor 55 connected in series, give rise to low level transients at the junction between the capacitors 47 and 48 in response to the very rapid changes in voltage across the capacitor 101 when it is discharged and when it is charged again shortly thereafter. The switching times are extremely fast and produce transients with a cycle time in the order of a microsecond. These transients are rejected as described above by the transistor pairs 55, 75 and 40, 81.

Values for certain of the components in FIG. 1 are set forth below by way of example to illustrate an operable device, and corresponding components in FIG. 2 may have similar values. It will be appreciated, however, that other suitable values may be selected by those skilled in the art to suit their particular design objectives without departing from the teachings of the present application.

Resistors in ohms

| | | | |
|---|---|---|---|
| **42, 83** | 5100 | **58, 78** | 1800 |
| **44, 84** | 475 | **60** | 1500 |
| **45** | 33,000 | **61** | 1300 |
| **46** | 24,000 | **62** | 15,000 |
| **49** | 16,000 | **66** | 10,000 |
| **50, 80** | 26,100 | **71** | 28,300 |
| **51, 73** | 63,400 | **92** | 220,000 |
| **53** | 2000 | **93** | 100,000 |
| **54, 76, 98** | 1000 | **99** | 2400 |

Capacitors in microfarads

| | | | |
|---|---|---|---|
| **47, 72** | .068 | **91** | .33 |
| **48, 79** | :1 | | |

In the preferred embodiments, diodes 63, 64, 213 and 214 are germanium and diodes 59, 211 and 212 are silicon.

Compression ratios in the order of ten or twenty to one can be achieved by suitable selection of the resistor values in the nonlinear impedance input to the shunting transistors 55 and 203 of FIGS. 1 and 2.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a signal attenuating circuit of the type in which means including a pair of series-connected capacitors couple signals from an input terminal thereof to an output terminal thereof, in which a transistor including a base electrode has its collector electrode connected to the junction between the capacitors and isolated from direct-current supplies to exhibit at each desired base current level a respective, substantially constant resistive shunting impedance to signals having a maximum amplitude below a predetermined low value, and in which a source of control voltage applied to the base electrode varies the base current exponentially with variations in the control voltage level, in the combination with the transistor and the source a nonlinear impedance network responsive to a selected range of variations in the control voltage for producing a base current which varies generally as a linear function of the control voltage comprising first, second, third and fourth resistors of selected values connected in series to apply the input control voltage to the base electrode, a device having the current-voltage characteristics of a semiconductor diode connecting the junction between the second and third resistors to a reference potential terminal for shunting current in accordance with said characteristic away from the base electrode at and above control voltage levels which produce significant levels of base current to cause the base current to vary substantially linearly with the control voltage within a lower predetermined range, and at least one device having the current-voltage characteristics of a semiconductor diode connecting the junction between the first and second resistors to the junction between the third and fourth resistors and effective to cause the base current to vary substantially linearly with the control voltage over a selected range immediately above said lower range.

2. In a signal attenuating circuit of the type in which means including a pair of series-connected capacitors couple signals from an input terminal thereof to an output terminal thereof, in which a transistor including base and emitter electrodes has its collector electrode connected to the junction between the capacitors and isolated from direct-current supplies to exhibit at each desired base current level a respective, substantially constant resistive shunting impedance to signals having a maximum amplitude below a predetermined low value, and in which a source of control voltage applied to the base varies the base current exponentially with variations in the control voltage level, in the combination with the transistor and the source a nonlinear impedance network responsive to a selected range of variations in the control voltage for producing a base current which varies generally as a linear function of the control voltage comprising first, second, third and fourth resistors of selected values connected in series to apply the input control voltage to the base electrode, a first device having the current-voltage characteristics of a semiconductor diode connecting the junction between the second and third resistors to a reference potential terminal for shunting current in accordance with said characteristic away from the base electrode to cause the base current to vary substantially linearly with the control voltage within a lower predetermined range, a biased semiconductor device having a voltage-current characteristic substantially matching that of the base-emitter junction of the transistor and connected to said first device to render the latter effective substantially at and above the control voltage level which produces a significant level of base current, and at least one device having the current-voltage characteristics of a semiconductor diode, connecting the junction between the first and second resistors to the junction between the third and fourth resistors and effective to cause the base current to vary substantially linearly with the control voltage over a selected range immediately above said lower range.

References Cited

UNITED STATES PATENTS

| | | | |
|---|---|---|---|
| 2,888,636 | 5/1959 | McManis. | |
| 3,117,287 | 1/1964 | Damico | 330—29 X |
| 3,210,680 | 10/1965 | Farris | 330—29 X |
| 3,316,424 | 4/1967 | Humphreys | 307—237 X |
| 3,441,748 | 4/1969 | Werner | 307—237 |

JOHN S. HEYMAN, Primary Examiner

S. D. MILLER, Assistant Examiner

U.S. Cl. X.R.

328—171; 330—29; 33—28, 80